US011476187B2

United States Patent
Takizawa et al.

(10) Patent No.: US 11,476,187 B2
(45) Date of Patent: Oct. 18, 2022

(54) SEMICONDUCTOR DEVICE HAVING CAPACITOR ON SUBSTRATE

(71) Applicant: DENSO CORPORATION, Kariya (JP)

(72) Inventors: Shin Takizawa, Kariya (JP); Seiji Noma, Kariya (JP); Yusuke Nonaka, Kariya (JP); Shinichirou Yanagi, Kariya (JP); Atsushi Kasahara, Kariya (JP); Shogo Ikeura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/084,854

(22) Filed: Oct. 30, 2020

(65) Prior Publication Data

US 2021/0074631 A1    Mar. 11, 2021

Related U.S. Application Data

(63) Continuation of application No. PCT/JP2019/018571, filed on May 9, 2019.

(30) Foreign Application Priority Data

May 21, 2018 (JP) .............................. JP2018-097252

(51) Int. Cl.
   *H01L 23/52*    (2006.01)
   *H01L 23/522*   (2006.01)

(52) U.S. Cl.
   CPC ................................ *H01L 23/5223* (2013.01)

(58) Field of Classification Search
   CPC ........................................ H01L 23/5222–5223
   See application file for complete search history.

(56) References Cited

U.S. PATENT DOCUMENTS

| 2002/0160577 | A1 | 10/2002 | Hosoda et al. |
| 2004/0000667 | A1 | 1/2004 | Baniecki et al. |
| 2007/0152295 | A1 | 7/2007 | Yeh et al. |
| 2011/0073993 | A1 | 3/2011 | Baniecki et al. |
| 2014/0367757 | A1 | 12/2014 | Jakushokas et al. |
| 2015/0221716 | A1 | 8/2015 | Jakushokas et al. |
| 2019/0157378 | A1* | 5/2019 | Luo ..................... H01L 27/0805 |
| 2021/0074629 | A1* | 3/2021 | Fernandes ................ H01G 4/40 |

FOREIGN PATENT DOCUMENTS

| JP | H07-312415 A | 11/1995 |
| JP | H10-200070 A | 7/1998 |
| JP | 2014229711 A | 12/2014 |
| JP | 2017017272 A | 1/2017 |

* cited by examiner

*Primary Examiner* — Suberr L Chi
(74) *Attorney, Agent, or Firm* — Posz Law Group, PLC

(57) ABSTRACT

On a substrate, a wiring layer is arranged by sequentially stacking a first insulation film, a lower electrode, a second insulation film, an intermediate electrode, a third insulation film, and an upper electrode in this order. A capacitor includes a first capacitor having the lower electrode and the intermediate electrode, and a second capacitor having the intermediate electrode and the upper electrode. The first capacitor and the second capacitor are connected in parallel to each other by electrically connecting the lower electrode and the upper electrode. Further, the intermediate electrode has a higher potential than the lower layer electrode and the upper electrode.

7 Claims, 3 Drawing Sheets

SEMICONDUCTOR DEVICE HAVING CAPACITOR ON SUBSTRATE

CROSS REFERENCE TO RELATED APPLICATION

The present application is a continuation application of International Patent Application No. PCT/JP2019/018571 filed on May 9, 2019, which designated the U.S. and claims the benefit of priority from Japanese Patent Application No. 2018-097252 filed on May 21, 2018. The entire disclosures of all of the above applications are incorporated herein by reference.

TECHNICAL FIELD

The present disclosure relates to a semiconductor device having a capacitor formed on a semiconductor substrate.

BACKGROUND

Conventionally, a semiconductor device in which a capacitor is formed on a semiconductor substrate has been proposed. For example, in this semiconductor device, a first electrode is formed on the substrate, and an oxide film or the like as a capacitance layer is formed on the first electrode. Then, the second electrode is formed on the capacitance layer.

SUMMARY

On a substrate, a wiring layer is arranged by sequentially stacking a first insulation film, a lower electrode, a second insulation film, an intermediate electrode, a third insulation film, and an upper electrode in this order. A capacitor includes a first capacitor having the lower electrode and the intermediate electrode, and a second capacitor having the intermediate electrode and the upper electrode. The first capacitor and the second capacitor are connected in parallel to each other by electrically connecting the lower electrode and the upper electrode. Further, the intermediate electrode has a higher potential than the lower layer electrode and the upper electrode.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
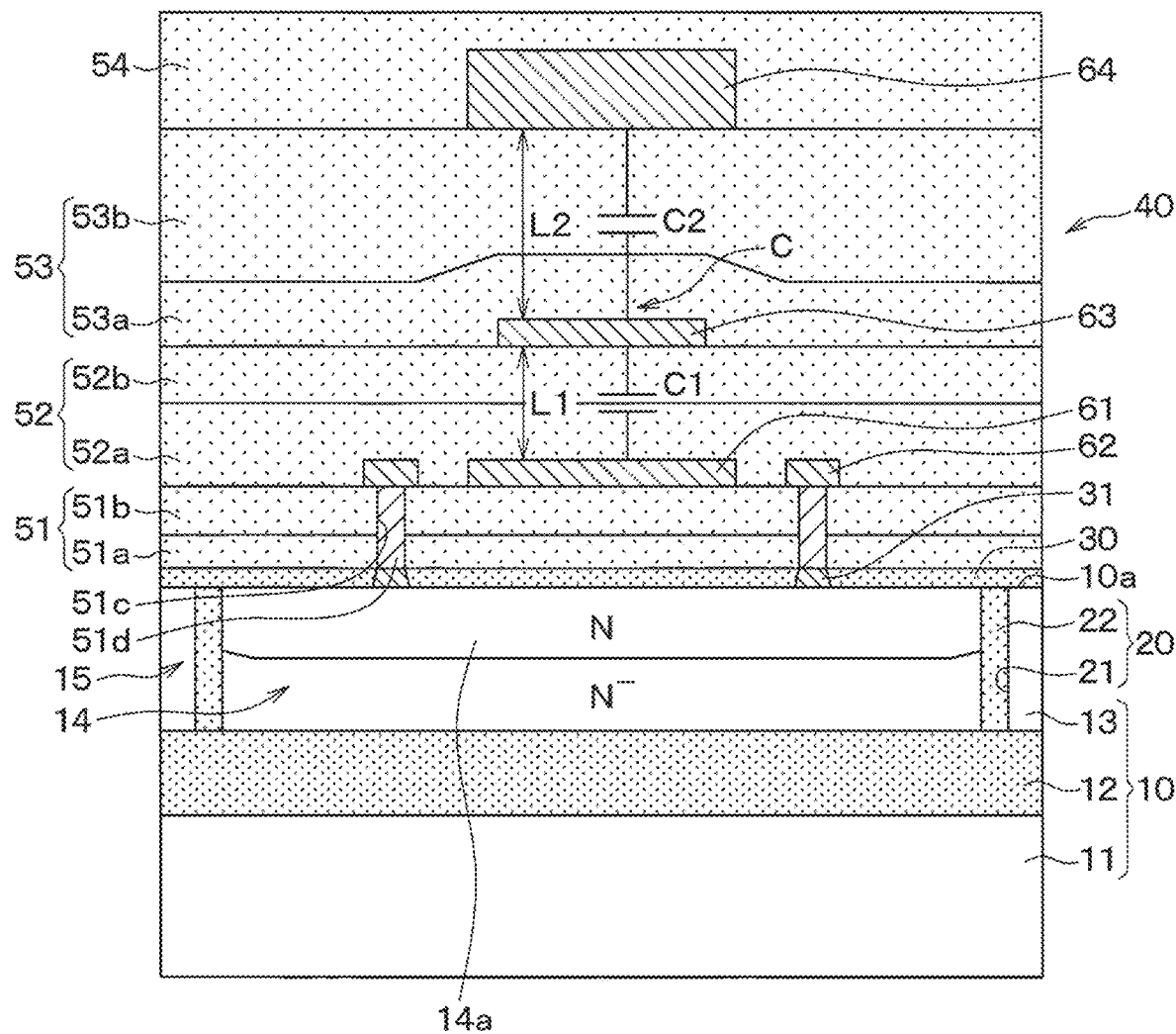
FIG. 1 is a cross-sectional view of a semiconductor device in a first embodiment.

A comparison semiconductor device does not define the magnitude of the potentials at the first electrode and the second electrode. Therefore, for example, when the first electrode has a higher potential than the second electrode, the parasitic capacitance between the first electrode and the substrate increases. In particular, when a high voltage of 100 V or more is applied between the first electrode and the second electrode, the parasitic capacitance with the substrate becomes remarkable, and a difficulty due to the parasitic capacitance may occur. Further, in a semiconductor device having such a capacitor, there is also a requirement for increasing the capacitance per unit area of the capacitor.

In view of the above point, a semiconductor device is provided to increase the capacitance per unit area while suppressing an increase in a parasitic capacitance.

According to one aspect of the present disclosure, a semiconductor device in which a capacitor is formed on a substrate includes: a substrate having a main surface; and a wiring layer arranged on the main surface and having a capacitor. The wiring layer includes: a first insulation film arranged on the substrate, a lower electrode arranged on the first insulation film, a second insulation film arranged on the first insulation film so as to cover the lower electrode; an intermediate electrode that is disposed on the second insulation film and faces the lower electrode; a third insulation film that is disposed on the second insulation film so as to cover the intermediate electrode; and an upper electrode that is disposed on the third insulation film and faces the intermediate electrode. The capacitor includes a first capacitor having the lower electrode and the intermediate electrode, and a second capacitor having the intermediate electrode and the upper electrode. The first capacitor and the second capacitor are connected in parallel to each other by electrically connecting the lower electrode section and the upper electrode, and the intermediate electrode has a higher potential than the lower electrode and the upper electrode.

According to this, since the intermediate electrode has a high potential, the lower electrode has a low potential. Therefore, the parasitic capacitance generated between the substrate and the capacitor can be reduced. Moreover, the capacitor is configured such that the first capacitor and the second capacitor are connected in parallel to each other. Therefore, the capacitance per unit area of the capacitor can be increased.

A reference numeral in parentheses attached to each configuration element or the like indicates an example of correspondence between the configuration element or the like and the specific configuration element or the like described in embodiments below.

Embodiments of the present disclosure will be described below with reference to the drawings. In each embodiment described below, same or equivalent parts are designated with the same reference numerals.

First Embodiment

A first embodiment will be described with reference to the drawings. As shown in FIG. 1, the semiconductor device according to the present embodiment is configured by use of an SOI (Silicon On Insulator) substrate 10 in which an active layer 13 is stacked over a support substrate 11 with interposition of a buried insulation film 12. The support substrate 11 is formed of a semiconductor substrate made of silicon or the like, and the buried insulation film 12 is formed of an oxide film or the like. The active layer 13 is formed of an n-type silicon substrate having a predetermined impurity concentration. In the following, the surface of the active layer 13 opposite to the buried insulation film 12 is also referred to as a main surface 10a of the SOI substrate 10.

In this embodiment, the active layer 13 is separated into the element region 14 and the field ground region 15 by the trench isolation portion 20. Specifically, the active layer 13 is isolated by the trench isolation portion 20 so that the element region 14 is surrounded by the field ground region 15.

The trench isolation portion 20 is formed by arranging the insulation film 22 in a groove 21 to fill and bury the groove 21, which is formed from the main surface 10a of the SOI substrate 10 to reach the buried insulation film 12. Incidentally, the insulation film 22 is disposed in the groove 21 by embedding an insulation material by thermal oxidation or deposition.

In the element region 14, in the present embodiment, an N-type well region 14a having a higher impurity concentration than the active layer 13 is formed in the surface portion of the active layer 13.

A surface insulation film 30 formed of an oxide film or the like is formed on the main surface 10a of the SOI substrate 10. A contact hole 30a exposing the well region 14a is formed in the surface insulation film 30. In this embodiment, a plurality of contact holes 30a are formed. A pad portion 31 connected to the well region is formed in the contact hole 30a on the main surface 10a of the SOI substrate 10.

The surface insulation film 30 is made of a tetraethoxysilane (TEOS: Tetra EthylOrthoSilicate) film or the like by a CVD (abbreviation of Chemical Vapor Deposition) method or the like. Below, the tetraethoxysilane film is also simply referred to as a TEOS film. The pad portion 31 is made of aluminum or the like.

Then, on the main surface 10a of the SOI substrate 10, the wiring layer 40 having the capacitor C with the metal insulator metal structure is formed via the surface insulation film 30.

Specifically, the first interlayer insulation film 51 is formed on the surface insulation film 30. In this embodiment, the first interlayer insulation film 51 is configured by sequentially stacking a first lower insulation film 51a and a first upper insulation film 51b on the SOI substrate 10 in this order. The first lower insulation film 51a is made of an oxide film by a CVD method with a high density plasma (i.e., HDP). The first upper insulation film 51b is made of a TEOS film by a CVD method or the like. Hereinafter, the oxide film formed by the high-density plasma chemical vapor deposition method is also referred to as an HDP film.

A contact hole 51c exposing the pad portion 31 is formed in the first interlayer insulation film 51. A connection via 51d formed by burying tungsten is arranged in the contact hole 51c.

A lower electrode 61 and a ground wiring portion 62 are formed on the first interlayer insulation film 51. The lower electrode 61 has a planar rectangular shape in the present embodiment. In this embodiment, two ground wiring portions 62 are arranged with sandwiching the lower layer electrode portion 61 therebetween. Then, each ground wiring portion 62 is connected to the well region 14a through the connection via 51d. In addition, in the present embodiment, each ground wiring portion 62 is arranged along one of the opposing sides of the lower electrode 61. That is, in FIG. 1, each ground wiring portion 62 extends along the depth direction on the drawing.

A second interlayer insulation film 52 is formed on the first interlayer insulation film 51 so as to cover the lower electrode 61 and the ground wiring portion 62. In this embodiment, the second interlayer insulation film 52 is configured by sequentially stacking a second lower insulation film 52a and a second upper insulation film 52b on the SOI substrate 10 in this order.

The second lower insulation film 52a is made of an HDP film, and the second upper insulation film 52b is made of a TEOS film or the like. In this case, since the HDP film has a higher embedding property than the TEOS film, the second lower insulation film 52a is made of the HDP film, so that it is possible to suppress the formation of a gap between the lower electrode 61 and the ground wiring portion 62 much more than a case where the second interlayer insulation film 52 is made of only the TEOS film.

An intermediate electrode 63 is formed on the second interlayer insulation film 52 so as to face the lower electrode portion 61. As a result, the lower electrode 61, the intermediate electrode 63, and the second interlayer insulation film 52 located between the lower electrode 61 and the intermediate electrode 63 are provided, and the second interlayer insulation film 52 provides a capacitance layer, so that a first capacitor C1 is formed. In addition, in the present embodiment, the intermediate electrode 63 has a planar rectangular shape.

Then, a third interlayer insulation film 53 is formed on the second interlayer insulation film 52 so as to cover the intermediate electrode 63. In this embodiment, the third interlayer insulation film 53 is configured by sequentially stacking a third lower insulation film 53a and a third upper insulation film 53b on the SOI substrate 10 in this order. The third lower insulation film 53a is made of an HDP film, and the third upper insulation film 53b is made of a TEOS film or the like. By thus forming the third lower insulation film 53a made of the HDP film, it is possible to suppress the formation of a gap between the third lower insulation film 53a and the intermediate electrode 63.

The upper electrode 64 is formed on the third interlayer insulation film 53 so as to face the intermediate electrode portion 63. As a result, the intermediate electrode 63, the upper electrode 64, and the third interlayer insulation film 53 located between the upper electrode 64 and the intermediate electrode 63 are provided, and the third interlayer insulation film 53 provides a capacitance layer, so that a second capacitor C2 is formed. In addition, in the present embodiment, the upper electrode 64 has a planar rectangular shape.

A fourth interlayer insulation film 54 is formed on the third interlayer insulation film 53 so as to cover the upper electrode 64. The fourth interlayer insulation film 54 is made of polyimide resin.

Figure 2:
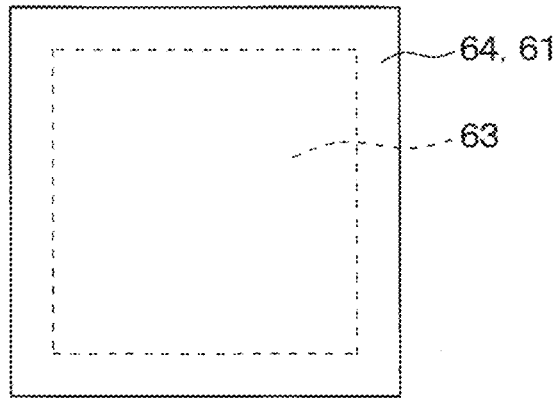
FIG. 2 is a plan view showing a positional relationship between a lower electrode, an intermediate electrode, and an upper electrode.

Here, in the present embodiment, the lower electrode 61, the intermediate electrode 63, and the upper electrode 64 are formed such that the intermediate electrode 63 has a smaller planar shape than the lower electrode 61 and the upper electrode 64. In this embodiment, the lower electrode 61 and the upper electrode 64 have the same plane size. When viewing along a normal direction (hereinafter, also simply referred to as normal direction) with respect to the lower electrode 61, the intermediate electrode 63, and the upper electrode 64, as shown in FIG. 2, the intermediate electrode 63 is formed inside the lower electrode 61 and the upper electrode 64. When viewing along the normal direction with respect to the lower electrode 61, the intermediate electrode 63, and the upper electrode 64, the intermediate electrode portion 63 does not protrude from the lower electrode 61 and the upper electrode 64. In addition, viewing from the normal direction to the main surface 10a, in other words, means the direction normal to the main surface 10a.

Further, in the present embodiment, the distance L1 between the lower electrode 61 and the intermediate electrode 63 in the first capacitor C1 is narrower than the distance L2 between the intermediate electrode 63 and the upper electrode 64 in the second capacitor C2. That is, the thickness of the second interlayer insulation film 52 located between the lower electrode 61 and the intermediate electrode 63 is thinner than the thickness of the third interlayer insulation film 53 located between the intermediate electrode 63 and the upper electrode 64.

Figure 3:
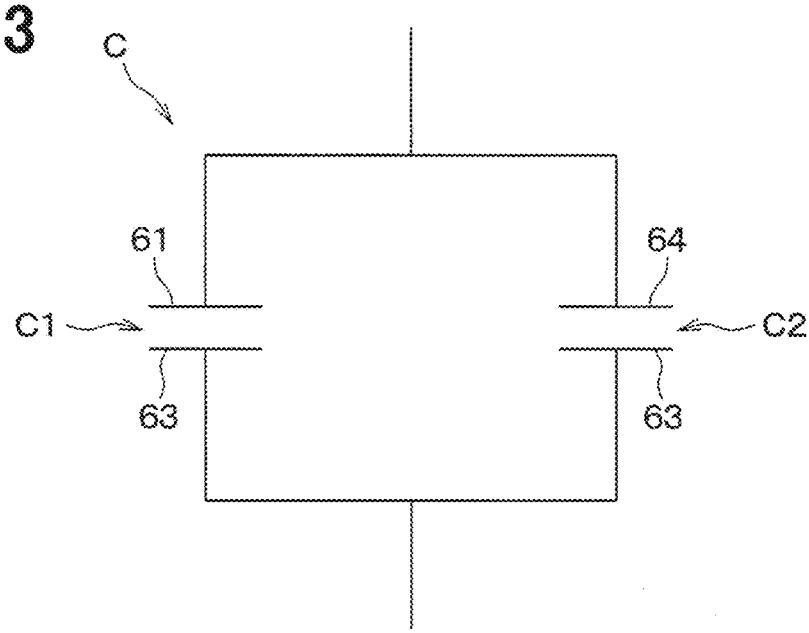
FIG. 3 is a circuit diagram of a capacitor in the first embodiment.

Further, the lower electrode 61, the intermediate electrode 63, and the upper electrode 64 are respectively connected to other wiring portions in a cross section different from FIG. 1. Then, in the semiconductor device of this embodiment, the intermediate electrode 63 has a high potential, and the lower electrode 61 and the upper electrode 64 have a low potential. More specifically, the lower electrode 61 and the upper electrode 64 are electrically connected via another wiring portion and have the same potential. That is, as shown in FIG. 3, the capacitor C in the semiconductor device of this embodiment has a first capacitor C1 and a second capacitor C2, and the first capacitor C1 and the second capacitor C2 are connected in parallel to each other.

In the present embodiment, the wiring portion connected to the lower electrode 61 and the upper electrode 64, and the wiring portion connected to the intermediate electrode 63, when viewed from the normal direction, are arranged to be opposite to each other with sandwiching each electrode 61, 63 and 64. Further, the wiring portion connected to the lower electrode 61 and the upper electrode 64 and the wiring portion connected to the intermediate electrode 63 are formed so as not to intersect with the ground wiring portion 62 when viewed in the normal direction. For example, in FIG. 1, the wiring portion connected to the lower electrode 61 and the upper electrode 64 is drawn out to the front side of the drawing, and the wiring portion connected to the intermediate electrode 63 is drawn out to the depth side of the drawing. This can reduce the parasitic capacitance that may occur between these wiring portions.

The ground wiring portion 62 is also connected to another wiring portion in a cross section different from that of FIG. 1, and is maintained at the ground potential. Therefore, the well region 14a is maintained at the ground potential.

As described above, in the present embodiment, the lower electrode 61, the intermediate electrode 63, and the upper electrode 64 are stacked, and the lower electrode 61 has a low potential. Therefore, the parasitic capacitance generated between the SOI substrate 10 and the capacitor C can be reduced.

Further, the capacitor C is configured such that the first capacitor C1 having the lower electrode 61 and the intermediate electrode 63 and the second capacitor C2 having the intermediate electrode 63 and the upper electrode 64 are connected in parallel to each other. Therefore, the capacitance per unit area of the capacitor C can be increased.

Further, in the present embodiment, the intermediate electrode 63 is located inside the lower electrode 61 and the upper electrode 64 when viewed from the normal direction. Therefore, it is possible to suppress a change in the facing area between the intermediate electrode 63 and the lower electrode 61 when a displacement of the positions occurs, and to prevent a change in the facing area between the intermediate electrode 63 and the upper electrode 64. That is, it is possible to prevent the capacitance of the capacitor C from varying when the position shift occurs. Further, since the intermediate electrode 63 is positioned inside the lower electrode 61 when viewed from the normal direction, it is possible to suppress the generation of the parasitic capacitance between the SOI substrate 10 and the intermediate electrode 63 which is at high potential.

Further, the distance L1 of the first capacitor C1 is narrower than the distance L2 of the second capacitor C2. Therefore, the breakdown voltage of the capacitor C depends on the first capacitor C1. Here, in the semiconductor device, the interlayer insulation films 51 to 54, the electrodes 61, 63, and 64, the ground wiring portion 62, and the like are sequentially formed on the main surface 10a of the SOI substrate 10 in this order from the main surface 10a side. However, the manufacturing error may tend to increase at a portion manufactured in a later step. For this reason, in the present embodiment, the withstand voltage of the capacitor C is defined by the first capacitor C1 having a smaller manufacturing error, so that it is possible to suppress the variation of the withstand voltage of the capacitor C.

Then, in the present embodiment, the ground wiring portion 62 connected to the well region 14a is formed. Therefore, when the noise is propagated to the element region 14, the noise can be discharged through the ground wiring portion 62. Therefore, it is possible to prevent the characteristics of the capacitor C from changing due to the noise.

Second Embodiment

A second embodiment will be described next. In this embodiment, the configuration of the third interlayer insulation film 53 is different from that of the first embodiment. The remaining configuration is similar to that according to the first embodiment and will thus not be described repeatedly.

Figure 4:
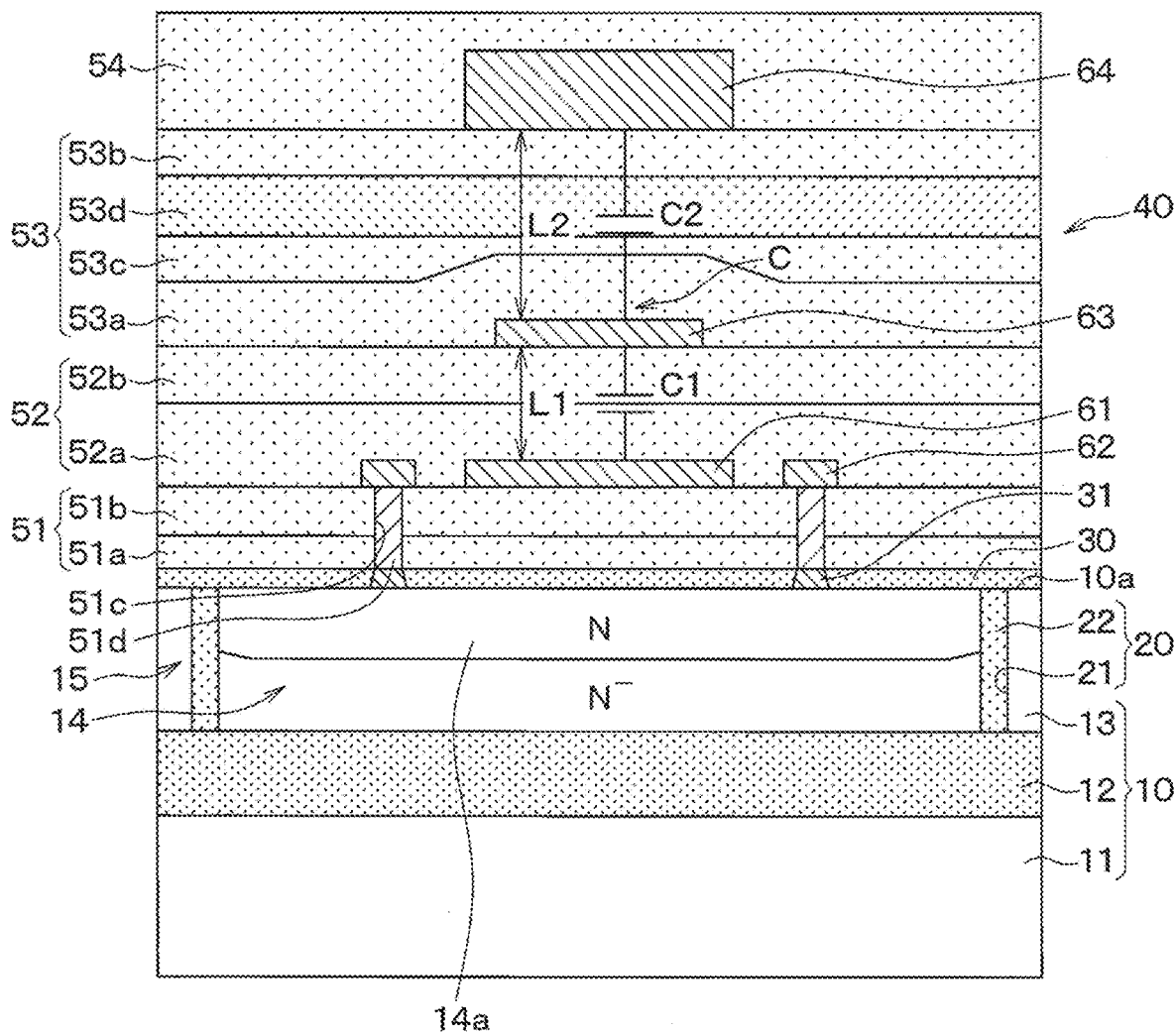
FIG. 4 is a cross-sectional view of a semiconductor device in a second embodiment.

In the present embodiment, as shown in FIG. 4, the third interlayer insulation film 53 is formed such that the third middle lower insulation film 53c and the third middle upper insulation film 53d are formed in this order from the third lower insulation film 53a side between the third lower insulation film 53a and the third upper insulation film 53b. The third middle lower insulation film 53c is made of a TEOS film. The third middle upper insulation film 53d is made of a nitride film. That is, the second capacitor C2 is configured such that the capacitance layer has the oxide film and the nitride film.

Here, the relationship between the voltage applied to the capacitor and the capacitance change rate studied by the present inventors will be described with reference to FIG. 5. Note that the capacitance change rate of FIG. 5 shows the variation rate of the capacitance over various voltage with respect to the reference value, which is the capacitance at 70 V.

Figure 5:
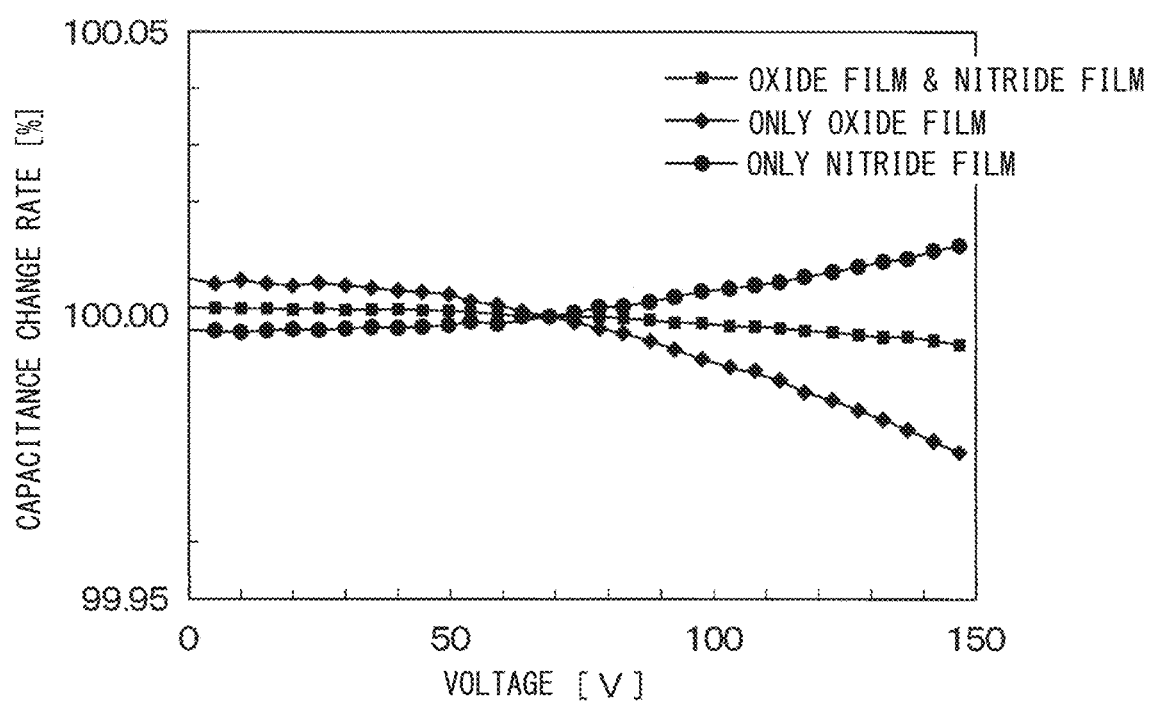
FIG. 5 is a diagram showing a relationship between a voltage and a capacitance change rate.

As shown in FIG. 5, when the capacitance layer is made of an oxide film, it is confirmed that, in the region where the voltage is less than 70 V, the capacitance becomes larger with respect to the reference value as the voltage becomes smaller. Also, in the region where the voltage is higher than 70 V, it is confirmed that the higher the voltage is, the smaller the capacitance is with respect to the reference value.

On the other hand, when the capacitance layer is made of a nitride film, it is confirmed that, in a region where the voltage is less than 70 V, the capacitance becomes smaller with respect to the reference value as the voltage becomes smaller. Also, in the region where the voltage is higher than 70 V, it is confirmed that the higher the voltage is, the larger the capacitance is with respect to the reference value.

That is, it is confirmed that the characteristics of the capacitance with respect to the voltage are opposite between a case where the capacitance layer is made of an oxide film and a case where the capacitance layer is made of a nitride film. It is confirmed that, when the capacitance layer is made of an oxide film and a nitride film, the capacitance characteristics of the oxide film and the nitride film are mixed, so that the capacitance variation is reduced.

Therefore, in the present embodiment, as described above, the third interlayer insulation film 53 is configured to have the oxide film and the nitride film, so that the change of the capacitance with respect to the voltage is reduced.

As described above, in the present embodiment, the third interlayer insulation film 53 is made of the oxide film and the nitride film. Therefore, it is possible to obtain the same effect as that of the first embodiment while reducing the variation of the capacitance with respect to the voltage of the second capacitor C2.

In addition, since the third interlayer insulation film 53 has the structure including the nitride film, the nitride film has a lower moisture permeability than the oxide film, so that it is possible to suppress the moisture from penetrating into the SOI substrate 10 from the third middle upper insulation film 53d.

Other Embodiments

Although the present disclosure has been described in accordance with embodiments, it is understood that the present disclosure is not limited to such embodiments or structures. The present disclosure encompasses various modifications and variations within the scope of equivalents. In addition, other combinations and configurations including further only a single element, more or less, are also within the spirit and scope of the present disclosure.

For example, in each of the above embodiments, the distance of the first capacitor C1 may be wider than the distance of the second capacitors C2. Further, in each of the above-described embodiments, the intermediate electrode 63 may have a shape protruding from the lower electrode 61 and the upper electrode 64 when viewed from the normal direction. In addition, in each of the above-described embodiments, the ground wiring portion 62 may not be arranged along one of the opposing sides of the lower electrode 61, or may not be provided. Even in the case of such a semiconductor device, the parasitic capacitance formed by the SOI substrate 10 and the capacitor C can be reduced by setting the lower electrode 61 to be a low potential.

Further, in the first embodiment, the first to third interlayer insulation films 51 to 53 may be made of only the HDP film or may be made of only the TEOS film. That is, the first to third interlayer insulation films 51 to 53 may be made of only one insulation film. Further, each of the first to third interlayer insulation films 51 to 53 may further have a plurality of insulation films stacked thereon. For example, the second interlayer insulation film 52 may be formed by stacking a TEOS film, an HDP film, and a TEOS film, or may be formed by stacking a plurality of insulation films. Similarly, also in the second embodiment, the number of insulation films for forming the first to third interlayer insulation films 51 to 53 may be appropriately changed. Further, in each of the above embodiments, the lower electrode 61, the intermediate electrode 63, and the upper electrode 64 may not have a planar rectangular shape, and may have, for example, a circular shape.

Further, in the second embodiment, the second interlayer insulation film 52 may also have a nitride film. That is, the capacitance layer of the first capacitor C1 may be made of an oxide film and a nitride film. According to this, the variation of the capacitance with respect to the voltage of the first capacitor C1 can be reduced. In this case, both the capacitance layers of the first capacitor C1 and the second capacitor C2 may be made of an oxide film and a nitride film, or only the capacitance layer of the first capacitor C1 may be made of an oxide film and a nitride film.

In the second embodiment, the third middle lower insulation film 53c may not be arranged, alternatively, the third middle upper insulation film 53d made of a nitride film may be arranged on the third lower insulation film 53a. Further, in the second embodiment, the third upper insulation film 53b may not be arranged, and the upper electrode 64 may be arranged on the third middle upper insulation film 53d.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device in which a capacitor is arranged on a substrate, the semiconductor device comprising:
   the substrate having a main surface; and
   a wiring layer arranged on the main surface and having the capacitor,
   wherein:
   the wiring layer includes:
      a first insulation film disposed on the substrate;
      a lower electrode arranged on the first insulation film;
      a second insulation film disposed on the first insulation film so as to cover the lower electrode;
      an intermediate electrode disposed on the second insulation film and facing the lower electrode;
      a third insulation film disposed on the second insulation film so as to cover the intermediate electrode; and
      an upper electrode arranged on the third insulation film and facing the intermediate electrode;
   the capacitor includes a first capacitor having the lower electrode and the intermediate electrode, and a second capacitor having the intermediate electrode and the upper electrode;
   the first capacitor and the second capacitor are connected in parallel to each other by electrically connecting the lower electrode and the upper electrode;
   the intermediate electrode has a higher potential than the lower electrode and the upper electrode;
   the intermediate electrode is located entirely inside at least one of the lower electrode and the upper electrode in a direction parallel to the main surface of the substrate, and
   a distance between the lower electrode and the intermediate electrode is smaller than a distance between the intermediate electrode and the upper electrode.

2. The semiconductor device according to claim 1 wherein:
   at least one of the second insulation film and the third insulation film is configured by stacking an oxide film and a nitride film.

3. A semiconductor device in which a capacitor is arranged on a substrate, the semiconductor device comprising:
   the substrate having a main surface;
   a wiring layer arranged on the main surface and having the capacitor;

a well region arranged in a main surface portion of the substrate; and
a ground wiring arranged on the first insulation film,
wherein:
the wiring layer includes:
  a first insulation film disposed on the substrate;
  a lower electrode arranged on the first insulation film;
  a second insulation film disposed on the first insulation film so as to cover the lower electrode;
  an intermediate electrode disposed on the second insulation film and facing the lower electrode;
  a third insulation film disposed on the second insulation film so as to cover the intermediate electrode; and
  an upper electrode arranged on the third insulation film and facing the intermediate electrode;
the capacitor includes a first capacitor having the lower electrode and the intermediate electrode, and a second capacitor having the intermediate electrode and the upper electrode;
the first capacitor and the second capacitor are connected in parallel to each other by electrically connecting the lower electrode and the upper electrode;
the intermediate electrode has a higher potential than the lower electrode and the upper electrode;
the intermediate electrode is located entirely inside at least one of the lower electrode and the upper electrode in a direction parallel to the main surface of the substrate, and
the ground wiring is connected to the well region and maintains the well region at a ground potential.

4. A semiconductor device in which a capacitor is arranged on a substrate, the semiconductor device comprising:
the substrate having a main surface; and
a wiring layer arranged on the main surface and having the capacitor,
wherein:
the wiring layer includes:
  a first insulation film disposed on the substrate;
  a lower electrode arranged on the first insulation film;
  a second insulation film disposed on the first insulation film so as to cover the lower electrode;
  an intermediate electrode disposed on the second insulation film and facing the lower electrode;
  a third insulation film disposed on the second insulation film so as to cover the intermediate electrode;
  an upper electrode arranged on the third insulation film and facing the intermediate electrode;
  a well region arranged in a main surface portion of the substrate; and
  a ground wiring arranged on the first insulation film,
the capacitor includes a first capacitor having the lower electrode and the intermediate electrode, and a second capacitor having the intermediate electrode and the upper electrode;
the first capacitor and the second capacitor are connected in parallel to each other by electrically connecting the lower electrode and the upper electrode;
the intermediate electrode has a higher potential than the lower electrode and the upper electrode; and
a distance between the lower electrode and the intermediate electrode is smaller than a distance between the intermediate electrode and the upper electrode; and
the ground wiring is connected to the well region and maintains the well region at a ground potential.

5. The semiconductor device according to claim 4, wherein:
at least one of the second insulation film and the third insulation film is configured by stacking an oxide film and a nitride film.

6. A semiconductor device in which a capacitor is arranged on a substrate, the semiconductor device comprising:
the substrate having a main surface; and
a wiring layer arranged on the main surface and having the capacitor,
wherein:
the wiring layer includes:
  a first insulation film disposed on the substrate;
  a lower electrode arranged on the first insulation film;
  a second insulation film disposed on the first insulation film so as to cover the lower electrode;
  an intermediate electrode disposed on the second insulation film and facing the lower electrode;
  a third insulation film disposed on the second insulation film so as to cover the intermediate electrode; and
  an upper electrode arranged on the third insulation film and facing the intermediate electrode;
the capacitor includes a first capacitor having the lower electrode and the intermediate electrode, and a second capacitor having the intermediate electrode and the upper electrode;
the first capacitor and the second capacitor are connected in parallel to each other by electrically connecting the lower electrode and the upper electrode; and
the intermediate electrode has a higher potential than the lower electrode and the upper electrode,
the semiconductor device further comprising:
a well region arranged in a main surface portion of the substrate; and
a ground wiring arranged on the first insulation film,
wherein:
the ground wiring is connected to the well region and maintains the well region at a ground potential.

7. The semiconductor device according to claim 6, wherein:
at least one of the second insulation film and the third insulation film is configured by stacking an oxide film and a nitride film.

* * * * *